(12) United States Patent
Meuris et al.

(10) Patent No.: US 12,419,132 B2
(45) Date of Patent: Sep. 16, 2025

(54) METHOD FOR INTERCONNECTING PHOTOVOLTAIC CELLS AND PHOTOVOLTAIC CELL ASSEMBLY

(71) Applicants: IMEC VZW, Leuven (BE); UNIVERSITEIT HASSELT, Hasselt (BE)

(72) Inventors: Marc Meuris, Keerbergen (BE); Tom Borgers, Liège (BE)

(73) Assignees: IMEC VZW, Leuven (BE); Universiteit Hasselt, Hasselt (BE)

( * ) Notice: Subject to any disclaimer, the term of this patent is extended or adjusted under 35 U.S.C. 154(b) by 430 days.

(21) Appl. No.: 18/006,317

(22) PCT Filed: Jul. 1, 2021

(86) PCT No.: PCT/EP2021/068149
§ 371 (c)(1),
(2) Date: Jan. 20, 2023

(87) PCT Pub. No.: WO2022/017756
PCT Pub. Date: Jan. 27, 2022

(65) Prior Publication Data
US 2023/0299226 A1  Sep. 21, 2023

(30) Foreign Application Priority Data
Jul. 22, 2020 (EP) .................... 20187110

(51) Int. Cl.
*H10F 71/00* (2025.01)
*H10F 19/90* (2025.01)

(52) U.S. Cl.
CPC ....... *H10F 71/1375* (2025.01); *H10F 19/904* (2025.01)

(58) Field of Classification Search
CPC .. H10F 71/1375; H10F 19/904; H10F 10/167; H10F 19/906; Y02E 10/541;
(Continued)

(56) References Cited

U.S. PATENT DOCUMENTS

2010/0131108 A1  5/2010  Meyer
2019/0027624 A1*  1/2019  Stutterheim ............ H02S 40/36

FOREIGN PATENT DOCUMENTS

| DE | 102009035703 A1 | 2/2011 |
| EP | 3410494 A1 | 12/2018 |
| KR | 101925505 B1 * | 2/2019 |

OTHER PUBLICATIONS

PCT International Search Report and Written Opinion, Application No. PCT/EP2021/068149, mailed Oct. 20, 2021, 11 pages.

\* cited by examiner

*Primary Examiner* — Earl N Taylor
(74) *Attorney, Agent, or Firm* — McDonnell Boehnen Hulbert & Berghoff LLP

(57) ABSTRACT

The present disclosure related to a method for interconnecting photovoltaic cells in order to form a photovoltaic cells assembly is provided. The method comprises the steps of providing a first photovoltaic cell comprising a first surface, a second surface, a first edge, and a second edge, arranging a conductive wire on the first surface of the first photovoltaic cell according to a certain pattern, and attaching the conductive wire to the first surface of the first photovoltaic cell with the aid of a first non-conductive yarn by stitching in the area of the first edge of the first photovoltaic cell according to a first stitch type.

22 Claims, 12 Drawing Sheets

(58) Field of Classification Search
CPC ............ H01L 31/0749; H01L 31/0508; H01L 31/0512; H01L 31/188
See application file for complete search history.

METHOD FOR INTERCONNECTING PHOTOVOLTAIC CELLS AND PHOTOVOLTAIC CELL ASSEMBLY

CROSS-REFERENCE TO RELATED APPLICATIONS

The present application is a national stage entry of International Patent Application No. PCT/EP2021/068149, filed Jul. 1, 2021, which claims priority to European Patent Application No. 20187110.0 filed Jul. 22, 2020, the contents of which are hereby incorporated by reference.

FIELD OF THE DISCLOSURE

The present disclosure relates to a method for interconnecting photovoltaic cells in order to form a photovoltaic cells assembly and a photovoltaic cells assembly being producible by the steps of the method.

BACKGROUND

Generally, in times of an increasing number of renewable energy applications employing photovoltaic cells, photovoltaic cells assemblies or photovoltaic modules, respectively, there is a growing need of a method for interconnecting photovoltaic cells in order to form a photovoltaic cells assembly or a photovoltaic module and of a photovoltaic cells assembly or photovoltaic module being producible by the steps of the method in order to produce or provide such photovoltaic cells assemblies and photovoltaic modules in a highly accurate and efficient manner potentially suitable for implementation in a production environment with high throughput.

DE 10 2009 035 703 A1 relates to a method for generation of a system of flexible thin-film solar cells by electrically connecting individual cells or cell complexes. The method involves piercing the thin-film solar cells from the front side through the carrier in a narrow region. An electrically conductive wire covered with an insulating coating is guided through the formed openings. In other words, the thin-film solar cells are sewn using the covered and thus electrically insulated wire. In addition to this, the insulating coating of the electrically conductive wire is etched locally to enable the formation of an electrical connection between the wire and contacts of the thin-film solar cells. Disadvantageously, due to the sewing and local etching of the insulation of the wire, on the one hand, the example method is complex and costly, and on the other hand, the solar cells generated thereby are prone to inaccuracies and defects. Further disadvantageously, due to forces acting on the electrically conductive wires during sewing there is a risk of breakage of the wires, which may lead to loss of electrical connections and reduced performance of the system.

SUMMARY

The present disclosure provides a method for interconnecting photovoltaic cells in order to form a photovoltaic cells assembly and a photovoltaic cells assembly being producible by the steps of the method, whereby both a particularly high cost-efficiency and a notably high accuracy are ensured.

In some example embodiments, a method for interconnecting photovoltaic cells in order to form a photovoltaic cells assembly is provided. The method comprises the steps of providing a first photovoltaic cell comprising a first surface, a second surface, a first edge, and a second edge, arranging a conductive wire on the first surface of the first photovoltaic cell according to a certain pattern, and attaching the conductive wire to the first surface of the first photovoltaic cell with the aid of a first non-conductive yarn by stitching in an area of the first edge of the first photovoltaic cell according to a first stitch type. Due to a reduced complexity, a particularly high cost-efficiency and a notably high accuracy are provided. Further, the method for interconnecting photovoltaic cells establishes an interconnection between the photovoltaic cells.

In some example embodiments, due to a substantial reduction of forces acting on the conductive wire as compared to methods involving conductive wire stitching, a risk of breakage of the conductive wire is reduced, and consequently a risk of loss of electrical connections negatively affecting the device performance is reduced.

With respect to the edges, it is noted that the first edge may be opposing the second edge. With respect to the conductive wire, it is noted that the conductive wire may be an electrically conductive wire. With respect to the first non-conductive yarn, it is noted that the first non-conductive yarn may be a first electrically non-conductive yarn. With respect to the interconnection between photovoltaic cells, it is noted that the interconnection may be an electrical interconnection.

It is noted that attaching the conductive wire to the first surface of the first photovoltaic cell may comprise connecting, electrically connecting, the conductive wire to a contact structure or a contact layer on the first surface of the first photovoltaic cell, thereby establishing a contact, an electrical contact between the conductive wire and the contact structure or contact layer.

In some example embodiments, an electrical connection between the conductive wire and the contact structure or contact layer of the first photovoltaic cell can be established without any complex process steps, such as, for example, without the need for locally removing an insulating coating from the conductive wire. Therefore, a relatively simple process is provided with a reduced number of process steps, which leads to reduced manufacturing costs.

It is further noted that the first non-conductive yarn may be stitched through the first photovoltaic cell.

In some example embodiments, the method comprises the step of additionally attaching the conductive wire to the first surface of the first photovoltaic cell with the aid of a second non-conductive yarn by stitching in an area of the second edge of the first photovoltaic cell according to a second stitch type. Accordingly, the probability of defects due to incorrect interconnections can further be reduced by accurately attaching the wire.

It is noted that the second non-conductive yarn may be stitched through the first photovoltaic cell.

In some example embodiments the second stitch type may be equal to the first stitch type. Alternatively, the first stitch type may be equal to the second stitch type.

In some example embodiments, stitching according to the second stitch type is configured to pull a loop being fed through a hole in the first photovoltaic cell with the aid of the second non-conductive yarn over an edge, for example, the second edge, of the first photovoltaic cell along the second surface of the first photovoltaic cell. In addition to this or as an alternative, the second stitch type comprises or is an ISO #501 stitch or an over-edge stitch or an overlock stitch or an overedge chainstitch, such as a one-thread over-edge chainstitch.

For example, the second non-conductive yarn may be wrapped around the second edge of the first photovoltaic cell. This may thereby also separate and isolate, (e.g., electrically isolate), in a later stage the second edge of the first photovoltaic cell from a first edge of a further photovoltaic cell to be provided next to it.

Further, in the case of the usage of a foil for cell edge insulation, the second stitch type may comprise or be an ISO #101 stitch or a chainstitch.

In some example embodiments, the first photovoltaic cell comprises or is a thin-film cell, such as a chalcogenide cell such as e.g. a CdTe (Cadmium Telluride) cell, a CIS (Copper Indium Selenide) cell, a CGS (Copper Gallium Selenide) cell, a CIGS (Copper Indium Gallium Selenide, Copper Indium Gallium Sulfide) cell, a kesterite cell such as a CZTS (Copper Zinc Tin Sulfide, Copper Zinc Tin Selenide) cell, a perovskite cell, an amorphous silicon cell, a microcrystalline silicon cell, a polycrystalline cell or an organic cell. Additionally or alternatively, the first edge and the second edge are parallel or approximately parallel with respect to each other. In addition to this or as an alternative, the conductive wire comprises at least one of copper, nickel, steel, stainless steel, aluminum, carbon fiber, or any combination thereof. Further additionally or further alternatively, the certain pattern comprises at least one of a zig-zag pattern, a sine-shaped pattern, a pattern being similar to a sine shape, or any combination thereof.

With respect to the conductive wire, it is noted that nickel may be preferred. Further, with respect to the certain pattern, it is noted that the pattern may additionally or alternatively comprise a plurality of straight lines (e.g., parallel to each other). In this case, arranging the conductive wire on the first surface of the cell need not be done with a swinging arm or swinging beam. In this context, it is noted that a swinging arm or beam, respectively, will be shown and explained below. A possible approach would for example be to provide a plurality of wires (e.g. from rolls of wires) parallel to each other (extending from the first edge of the cell to the second edge of the cell, and further extending beyond the second edge), and then stitch the wires with a first non-conductive wire at the first edge and with a second non-conductive wire at the second edge. When providing the second cell, this second cell may be provided on the part of the wires that extends beyond the second edge of the first cell (e.g., for series connection of the cell).

It is further noted that the approach with a plurality of parallel wires would also be suitable for parallel interconnection of subsequent cells. In such case a first plurality of wires could be provided underneath the cells and a second plurality of wires could be provided on top of the cells (such that, in the end, all first surfaces are connected at one hand, and all second surfaces are connected at the other hand). For example, there would be no need for cutting the conductive wire then (except at the end, when the desired number of cells is connected).

In further addition to this or as a further alternative, the first non-conductive yarn comprises at least one of polyolefin, nylon, or the combination thereof. Further additionally or further alternatively, in the case of the presence of the second non-conductive yarn, the second non-conductive yarn comprises at least one of polyolefin, nylon, or the combination thereof. For instance, steel foil may be used for making the copper indium gallium selenide cell by depositing active copper indium gallium selenide layers on the surface.

Further, it is noted that polyolefin may be more preferred than nylon. Of further note, with respect to the first non-conductive yarn and/or the second non-conductive yarn, the diameter of the first and/or the second non-conductive yarn may be between 50 and 300 micrometers, and may be between 100 and 200 micrometers.

For example, in the case that the conductive wire comprises carbon fiber, it is noted that the conductive wire may be a conductive yarn.

It is further noted that the conductive wires or conductive yarns, respectively, can be coated. In this context, such as in the case that the conductive wires or yarns may be connected, (e.g., electrically connected), to metal contact structures on the cells by soldering, the respective coatings, (e.g., metal coatings), may comprise at least one of Sn, Bi, Ag, Pb, In, Co, Cu, Ni, Zn, or any combination thereof. For example, a Cu- or Al-wire with such solderable coating may be used.

For example, it is noted that the diameter of the conductive wire may be between 20 and 400 micrometers, in some examples between 40 and 200 micrometers, and in further examples between 60 and 120 micrometers.

Additionally or alternatively to coating the respective wire or yarn, the corresponding contact pad or contact structure deposited on the solar cell may comprise at least one of Sn, Bi, Ag, Pb, In, Co, Cu, Ni, Zn, or any combination thereof in order to create a metallurgical contact with the wire or yarn, respectively.

Furthermore, in the case that the conductive wires or yarns may be connected, e.g., electrically connected, to conductive contact layers on the cells by means of an electrically conductive adhesive (ECA), an electrically conductive adhesive paste may be printed on the respective cell, or coated on the respective wires and/or yarns to create an electrical contact with a contact layer of the cell. The electrically conductive adhesive may be an isotropic conductive adhesive or an anisotropic conductive adhesive. For example, in such case a Cu-wire with Ni-coating may be used.

In order to establish an electrical connection between the conductive wires or yarns to metal structures on the cells, a heating step may be performed, for example, at a temperature in the range between 60 and 200 degrees Celsius, and in some examples, at a temperature in the range between 100 and 180 degrees Celsius. This heating step may be done just after having attached the conductive wire or yarn on the cell surface or it may be done later in the process, such as, for example, after having formed a photovoltaic cells assembly (as further described), or simultaneously with a heating step performed for encapsulation of the photovoltaic cells assembly (as further described). For example, in the latter case there is no need for a dedicated, separate heating step to establish the electrical connection, resulting in a reduction of the number of process steps and thus an efficient manufacturing process.

With respect to the non-conductive yarns, it is noted that the yarns may comprise an optically transparent material such as polyolefin or a material such as nylon. In some examples, the usage of the optically transparent material may be preferred.

With respect to substrates for the photovoltaic cells according to the invention such as conductive substrates, e.g., electrically conductive substrates, may be used. In this context, the conductive substrate may comprise or be a foil or a sheet, such as a metal foil or a metal sheet. It is further noted that the foil or sheet may comprise at least one of copper, steel, stainless steel, nickel, steel nickel, aluminum, or any combination thereof. Additionally or alternatively, the foil or sheet may comprise a coating such as a metal coating.

In this context, the coating may comprise at least one of Mo, Ag, Cu, Ni, Sn, Bi, Co, or any combination thereof.

Furthermore, with respect to layer stacks for the photovoltaic cells according to the invention, such a layer stack for copper indium gallium selenide cells and/or a copper indium selenide cells may comprise at least one of a first layer, e.g., a front contact layer, comprising Al-doped ZnO or ITO, a second layer, e.g., a window layer, comprising ZnO, e.g. intrinsic ZnO, a third layer, e.g., buffer layer or a n-type buffer layer, comprising CdS and/or ZnO and/or InO and/or ZnOS and/or InS, a fourth layer, e.g., an absorber layer or a p-type absorber layer, a fifth layer, such as a back contact layer, comprising Mo, a sixth layer, e.g., a substrate layer such as the above-mentioned substrates, or any combination thereof.

In this context, the sixth layer or substrate layer, respectively, may be a stainless-steel substrate, such as a stainless-steel substrate with a Mo coating. The stainless-steel substrate may be between 30 and 150 micrometers, and in some examples could be between 50 and 130 micrometers, thick.

In some example embodiments, the foregoing six layers may be arranged according to the above-described order. In other words, the top of the respective cell may be the first layer, whereas the bottom of the respective cell may be the sixth layer. Accordingly, the remaining layers may be sandwiched by the top and the bottom layer of the respective cell. In this context, the top of the cell may be the front side of the cell, i.e. the side of the cell adapted for being oriented towards a light source and thus for receiving illumination. The bottom of the cell may be the rear side or back side of the cell, i.e. the side opposite to the front side.

In some example embodiments for arranging the conductive wire, a swinging arm or beam is used. In addition to this or as an alternative, for stitching, a respective machine stitching presser foot and a corresponding needle are used. For example, complexity can further be reduced and manufacturing may be done in an automated way, which leads to an increased cost-efficiency.

Generally, with respect to the above-mentioned swinging arm or beam, it is noted that the swinging arm or beam may comprise or be a device being configured to feed the conductive wire and/or to arrange the conductive wire on the surface in a zigzag and/or sine-shaped movement/pattern, and often combined with two sewing presser feet.

In some example embodiments, the conductive wire is arranged in such a manner that at least a part, such as a wire loop or a wire loop pattern, of the conductive wire extends over the first surface, such as beyond an edge, of the first photovoltaic cell such as in the area of the second edge of the first photovoltaic cell. For instance, the wire loop can be used for forming the respective interconnection of photovoltaic cells in a highly accurate and efficient manner.

In some example embodiments, stitching according to the first stitch type is configured in a manner that the first non-conductive yarn passes through the first photovoltaic cell and/or interloops with itself on the second surface of the first photovoltaic cell. In addition to this or as an alternative, the first stitch type comprises or is an ISO #101 stitch or a chainstitch. For example, the foregoing stitch requires a low complexity stitching technique, which leads to an increased cost-efficiency.

In some example embodiments, it is noted that in accordance with the first stitch type, the corresponding needle passes through the respective cell and leaves behind a yarn loop at the backside, through which the next loop is passing.

In this context, the backside is the side or surface of the respective cell which is not directly touched by the presser foot holding the needle.

In some example embodiments, the method comprises the step of cutting the conductive wire if the certain pattern covers the first surface of the first photovoltaic cell according to a predefined manner. Additionally or alternatively, the method comprises the step of cutting the first non-conductive yarn if the certain pattern covers the first surface of the first photovoltaic cell according to a predefined manner. In further addition to this or as a further alternative, the method comprises the step of cutting the second non-conductive yarn if the certain pattern covers the first surface of the first photovoltaic cell according to a predefined manner. For instance, a high efficiency can be ensured by simply cutting the wire without any further steps.

In some example embodiments, the method comprises the steps of providing a second photovoltaic cell comprising a first surface, a second surface, a first edge, and a second edge, and aligning the second photovoltaic cell and the first photovoltaic cell on the basis of the second edge of the first photovoltaic cell and the first edge of the second photovoltaic cell. In this context, a second photovoltaic cell may be aligned in such a manner that a surface of the second photovoltaic cell covers the part, e.g., the wire loop or the wire loop pattern, of the conductive wire extending over the first surface, such as beyond an edge, e.g., beyond the second edge, of the first photovoltaic cell, and in some example embodiment the second photovoltaic cell may be arranged next to the first photovoltaic cell, such that the first edge of the second photovoltaic cell next to the second edge of the first photovoltaic cell such that the second photovoltaic cell is not overlapping the first photovoltaic cell.

For example, the respective interconnection between the first photovoltaic cell and the second photovoltaic cell is not based on shingling or partially overlapping cells, respectively, which leads to an avoidance of inactive areas, thereby ensuring a particularly high efficiency.

In some example embodiments, for a series connection of the cells, the second cell may be arranged on top of the wire loop or the wire loop pattern. Alternatively, for a parallel connection of the cells, the second cell may be arranged underneath the wire loop or the wire loop pattern.

In some example embodiments, as an alternative or in addition to the above-mentioned step of aligning the second photovoltaic cell and the first photovoltaic cell on the basis of the second edge of the first photovoltaic cell and the first edge of the second photovoltaic cell, it is noted that the method may comprise the step of arranging the second photovoltaic cell and the first photovoltaic cell next to each other with the second edge of the first photovoltaic cell next to the first edge of the second photovoltaic cell arranged in a nonoverlapping manner.

In some example embodiments, when providing the second photovoltaic cell and aligning the second photovoltaic cell and the first photovoltaic cell as described above, the second non-conductive yarn stitched in an area of the second edge of the first photovoltaic cell may thereby also separate and isolate the second edge of the first photovoltaic cell from the first edge of the second photovoltaic cell provided next to it, when the second non-conductive yarn is stitched according to a second stitch type, wherein the second non-conductive yarn is wrapped around the second edge of the first photovoltaic cell.

In some example embodiments, the method comprises the step of repeating at least a part of the method steps according to any of the implementation forms described above with respect to at least one further photovoltaic cell. For instance, the respective photovoltaic cells assembly may comprise between 40 and 80 cells, in some examples between 50 and 70 cells, and in some examples between 55 and 65 cells, such as 60 cells.

In some example embodiments, the number of cells that are connected in series depends on the output voltage that is needed for the envisaged application. This offers a large flexibility, and the assembly can be tuned to the application requirements.

Similarly, in some example embodiments, in case of a parallel connection, the number of cells that is connected in parallel depends on the output current that is needed for the envisaged application.

It is further noted that if a plurality of photovoltaic cells is connected in order to form a very large assembly. In this context, for instance, a roll may be formed. In other words, the assembly may be rolled up such that a roll comprising a plurality of cells is obtained. This roll could then, for example, be stored and/or sold. Later on, the required number of connected cells needed for a given application (i.e. customized) can be cut from this roll and then followed by encapsulation to form an encapsulated module.

In some example embodiments, a wire loop or a wire loop pattern of the conductive wire extending over the first surface, for example over an edge such as the second edge, of the first photovoltaic cell may be simultaneously attached to a second surface of a second photovoltaic cell through attaching a conductive wire, such as a second conductive wire, to a first surface of the second photovoltaic cell with the aid of the first non-conductive yarn by stitching in the area of the first edge of the second photovoltaic cell according to the first stitch type. It is noted that attaching the wire loop or wire loop pattern of the conductive wire to the second surface of the second photovoltaic cell may comprise connecting, e.g., electrically connecting, the conductive wire to a contact structure or a contact layer on the second surface of the second photovoltaic cell, thereby connecting the contact structure or contact layer on the second surface of the second photovoltaic cell to a contact structure or contact layer on the first surface of the first photovoltaic cell by means of the conductive wire. For example, when the substrate is a conductive substrate, e.g., an electrically conductive substrate, the substrate may have the function of a contact layer, e.g., electrical contact layer, at the second surface. For example, an electrical interconnection between the first photovoltaic cell and the second photovoltaic cell is created in a highly efficient and accurate manner.

In some example embodiments, the method comprises the step of encapsulating the photovoltaic cells assembly with the aid of an encapsulating material, e.g., a thermoplastic material such as a thermoplastic non-reactive material. In some examples a thermoplastic non-reactive polyolefin material may be utilized. Alternatively, the encapsulating material may comprise or be a thermoset material. For instance, the photovoltaic cells assembly can be protected in a particularly efficient manner and a photovoltaic module can be formed.

In some example embodiments, the melting point of the encapsulating material is below 180 degrees Celsius such as between 130 and 150 degrees Celsius. For example, not only a deterioration of copper indium gallium selenide layers but also a formation of any cavities can be avoided.

It is noted that the method might also work on silicon photovoltaic cells (e.g., small silicon photovoltaic cells), allowing higher interconnection temperatures. In this context, cells might need holes for alignment of stitching.

It is further noted that these holes are not only needed for alignment. In general, making holes through the cells (e.g., at the first edge and at the second edge) before stitching would be advantageous for all types of cells mentioned above. Such holes can be made simultaneously with the stitching, for example, by using 2 needles: a first needle to punch a hole, immediately followed by a second needle to do the stitching. Alternatively, the holes can be made beforehand, for example, by punching, by etching or by lasering.

In some example embodiments, the melting point of the first non-conductive yarn is in the same range as or equal to the melting point of the encapsulating material. In addition to this or as an alternative, the melting point of the second non-conductive yarn is in the same range as or equal to the melting point of the encapsulating material. For instance, the refractive index of at least one, and in some embodiments, each, of the yarns may be similar or equal to the refractive index of the encapsulating material, which leads to an improved aesthetical appearance of the photovoltaic cells assembly.

It is noted that the melting point of the first non-conductive yarn or the second non-conductive yarn, respectively, can also be higher. In this case, the yarn will not melt. Such a yarn may comprise aramid, polyimide, polyester, Liquid Crystal Polymer, a fiber-reinforced polymer and/or nylon. According to some example embodiments, a photovoltaic cells assembly is provided. In this context, the photovoltaic cells assembly is producible or produced by the steps of a method according to any of the implementation forms of the first aspect of the invention. Due to a reduced complexity, a particularly high cost-efficiency and a notably high accuracy are ensured.

BRIEF DESCRIPTION OF THE DRAWINGS

Exemplary embodiments of the invention are now further explained with respect to the drawings by way of example only, and not for limitation. In the drawings.

DETAILED DESCRIPTION

Figure 1:
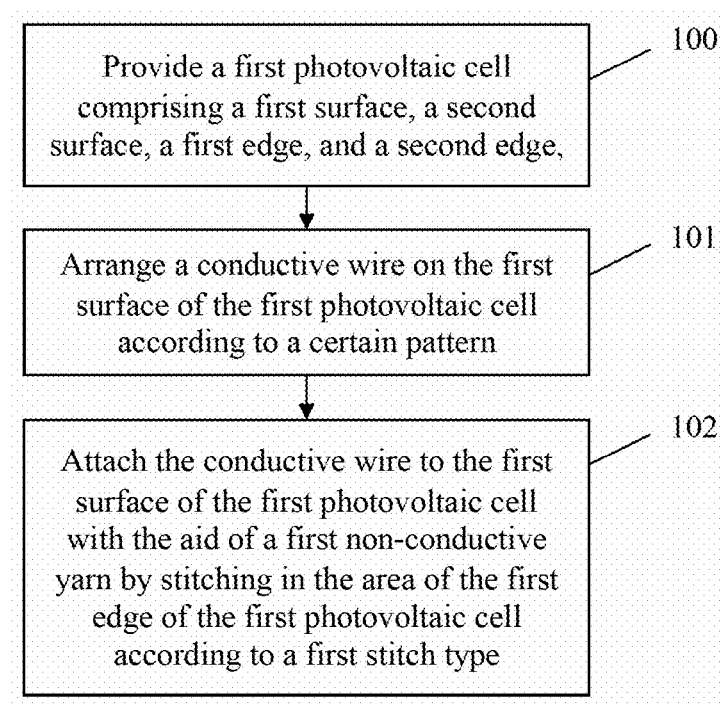
FIG. 1 shows a flow chart of an example embodiment.

Firstly, before one or more example embodiments will be explained with respect to the figures, some general aspects of the invention are described in the following:

Amongst other carrier materials (for instance, polymer sheets), steel foil is used for making copper indium gallium selenide (CIGS) solar modules by depositing active CIGS layers on the surface. To customize voltage and current, the foil is cut, and the individual resulting CIGS cells are connected in a series or parallel fashion.

Due to uncontrolled occurrence of deposition defects, the cut individual cells may be binned according to electrical performance and appearance to allow higher process yields and better performance.

The lack of efficient solutions for the connection of individual cut CIGS cells, high interconnection costs, limited process flexibility and the lack of possibilities to perform binning after cutting the foil is currently hindering a wide application of CIGS in building-integrated photovoltaic (BIPV) or other photovoltaic markets.

For instance, CIGS cells can be interconnected. The CIGS cells may be based on a CIGS stack deposited on a metal (conductive) carrier, having a front (transparent) contact and a back contact (conductive carrier).

In some examples, the carrier may be a metal steel foil with a thickness of +/−50 µm and 5 µm CIGS cell stack is deposited on the top surface, with a transparent conductive surface layer.

It is noted that the interconnection method can be used for parallel or series interconnection of individual cell strips, or interconnection of strings of cell strips. It is further noted that the cells may not be overlapping (no shingling) to avoid loss of inactive (shaded) area.

The interconnection may be achieved by using a conductive yarn or wire (for instance, Nickel metal), and a non-conductive polymer yarn (could be thermoplastic, and potentially optically transparent). It is further noted that the method may utilize stitching and/or broidering of wires/yarn.

Moreover, CIGS foil can be produced on roll in large continuous foil processing. Active layers are deposited on a polymer or metal foil. Inherently also defects are introduced, locally compromising electrical performance (i.e. recombination, shunts or the like). To allow maximal use of the foil, defected areas should be removed. Cutting the foil in strips of a specific size (i.e. providing a specific electrical current under illumination), allows for binning of the CIGS cell strips according to their electrical performance and appearance.

The strips are connected in a series configuration (to increase voltage) to create cell strings, or in parallel (to increase current). With embodiment described in greater detail below, the following benefits can be achieved:
- a reliable technology allowing (limited) compensation of thermal stress of long cell strings;
- a cheap method involving a very limited diversity of materials, and very few materials;
- a method relying on mechanical process technologies with low machine investment (stitching and embroidering with swinging arm for yarn guidance), material and process costs;
- an efficient and cost-effective solution for the connection of individual cells, involving low interconnection costs and a large process flexibility and allowing to perform binning; and
- an interconnection that is not based on shingling (i.e. not based on partially overlapping CIGS cells), avoiding inactive areas (higher CIGS cell surface yield).

Furthermore, for the sake of completeness, the following possible preliminary method or production steps should be mentioned:
- for instance, as a starting point, the foil is cut in pieces (cell strips) of approximately 1 cm to 5 cm×50 cm; and
- as an exemplary second step, binning is performed after measurement of a respective current-voltage-curve or after a photoluminescence measurement or an electroluminescence measurement.

In what follows, it is assumed that cell strips or cells of a specific performance and appearance are selected (from binning). The cell strips or cells are aligned along the long side of the cell strips or cells near to each other (so not overlapping or shingled) to create an interconnection of the top conductive transparent layer of a cell with the bottom contact (=steel foil carrier) of the neighbouring cell. To do so, a first cell is provided or positioned, respectively.

Now, with respect to the figures. FIG. 1 shows a flow chart of an example embodiment reflecting a method for interconnecting photovoltaic cells in order to form a photovoltaic cells assembly. In a first step 100, a first photovoltaic cell comprising a first surface, a second surface, a first edge, and a second edge are provided. Then, in a second step 101, a conductive wire is arranged on the first surface of the first photovoltaic cell according to a certain pattern. Furthermore, in a third step 102, the conductive wire is attached to the first surface of the first photovoltaic cell with the aid of a first non-conductive yarn by stitching in the area of the first edge of the first photovoltaic cell according to a first stitch type. In this context, it is noted that the step 100 can also be a part of the possible preliminary steps as already described above.

It is further noted that it might be advantageous if the method comprises the step of additionally attaching the conductive wire to the first surface of the first photovoltaic cell with the aid of a second non-conductive yarn by stitching in the area of the second edge of the first photovoltaic cell according to a second stitch type.

In this context, it might be advantageous if stitching according to the second stitch type is configured to pull a loop being fed through a hole in the first photovoltaic cell with the aid of the second non-conductive yarn to an edge, such as the second edge, of the first photovoltaic cell such as along the second surface of the first photovoltaic cell.

In addition to this or as an alternative, the second stitch type may comprise or be an ISO #501 stitch or an over-edge stitch or an overlook stitch or an over-edge chainstitch, such as a one-thread over-edge chainstitch. As already mentioned, the first photovoltaic cell may comprise or be a thin-film cell such as a copper indium gallium selenide (CIGS) cell.

It is noted that the second stitch type can additionally or alternatively comprise or be an ISO #101 stitch or a chainstitch, in particular for the embodiments with cell edge insulation by a transparent insulating foil (which will be described below).

In some embodiments there is no need for wrapping the second non-conductive yarn around the second edge of the first photovoltaic cell for obtaining edge insulation because the edge insulation is obtained by providing the insulating foil.

Additionally or alternatively, the first edge and the second edge may be parallel or approximately parallel with respect to each other. In addition to this or as an alternative, the conductive wire may comprise at least one of copper, nickel, steel, such as stainless steel, aluminum, carbon fiber, or any combination thereof.

In some embodiments, the certain pattern may comprise at least one of a zig-zag pattern, a sine-shaped pattern, a pattern being similar to a sine shape, or any combination thereof. For example, the first non-conductive yarn may comprise polyolefin and/or nylon. Additionally or alternatively, the second non-conductive yarn may comprise polyolefin and/or nylon.

Furthermore, it might be advantageous if for arranging the conductive wire, a swinging arm or beam is used. In addition to this or as an alternative, for stitching, a respective machine stitching presser foot and a corresponding needle may be used. Moreover, the conductive wire may be arranged in such a manner that at least a part, a wire loop or a wire loop pattern, of the conductive wire extends the first surface (for example beyond an edge such as beyond the second edge) of the first photovoltaic cell such as in the area of the second edge of the first photovoltaic cell.

It is noted that it might be advantageous if stitching according to the first stitch type is configured in a manner that the first non-conductive yarn passes through the first photovoltaic cell and/or interloops with itself on the second surface of the first photovoltaic cell. In addition to this or as an alternative, the first stitch type comprises or is an ISO #101 stitch or a chainstitch.

It is further noted that the method may comprise the step of cutting the conductive wire if the certain pattern covers the first surface of the first photovoltaic cell according to a predefined manner.

Additionally or alternatively, the method may comprise the steps of providing a second photovoltaic cell comprising a first surface, a second surface, a first edge, and a second edge, and aligning the second photovoltaic cell and the first photovoltaic cell on the basis of the second edge of the first photovoltaic cell and the first edge of the second photovoltaic cell. In this context, a second photovoltaic cell may be aligned in such a manner that a surface of the second photovoltaic cell covers the part, the wire loop or the wire loop pattern, of the conductive wire extending the first surface (for example beyond an edge such as beyond the second edge) of the first photovoltaic cell.

It might be advantageous if the method comprises the step of repeating at least a part of the method steps described above with respect to at least one further photovoltaic cell. In this context, a wire loop or a wire loop pattern of the conductive wire extending the first surface (for example beyond an edge such as beyond the second edge) of the first photovoltaic cell may simultaneously be attached to a second surface of a second photovoltaic cell through attaching a conductive wire, such as a second conductive wire, to a first surface of the second photovoltaic cell with the aid of the first non-conductive yarn by stitching in the area of the first edge of the second photovoltaic cell according to the first stitch type.

In this context of the second photovoltaic cell, it is noted that the first non-conductive yarn may be another one than for the first photovoltaic cell.

Furthermore, the method may comprise the step of encapsulating the photovoltaic cells assembly with the aid of an encapsulating material, such as a thermoplastic material and/or a thermoplastic non-reactive material that may be a thermoplastic non-reactive polyolefin material. In this context, it might be particularly advantageous if the melting point of the encapsulating material is below 180 degrees Celsius, such as between 130 and 150 degrees Celsius.

Moreover, the melting point of the first non-conductive yarn may be in the same range as or equal to the melting point of the encapsulating material. In addition to this or as an alternative, the melting point of the second non-conductive yarn may be in the same range as or equal to the melting point of the encapsulating material. Furthermore, it is noted that with the aid of at least a part of the foregoing method steps, a photovoltaic cells assembly can be produced.

It is further noted that different exemplary snapshots with respect to the formation of a photovoltaic cells assembly in the context of a further example embodiment are depicted with the aid of FIG. 2A to FIG. 2I.

Figure 2A:
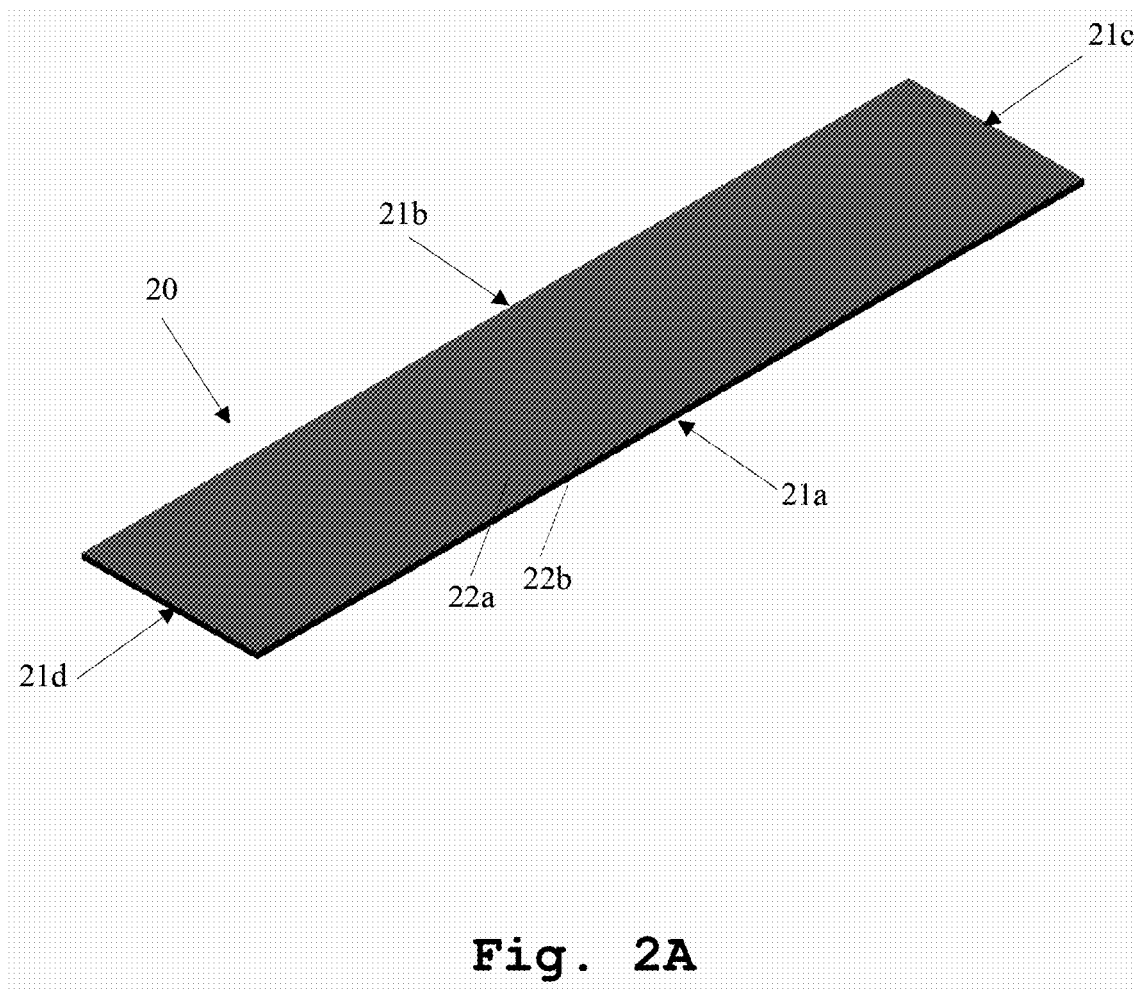
FIG. 2A shows a first snapshot with respect to the formation of a photovoltaic cells assembly according to an example embodiment.

According to FIG. 2A, a cell 20, which may be a CIGS cell, is provided or placed, respectively. In this context, the cell 20 comprises a first edge 21a, exemplarily a bottom edge, a second edge 21b, exemplarily a top edge, a third edge 21c, exemplarily a right edge, a fourth edge 21d, exemplarily a left edge, a first surface 22a, exemplarily a front surface, and a second surface 22b, exemplarily a back surface, which cannot be seen due to the two-dimensional illustration of FIG. 2A.

Figure 2B:
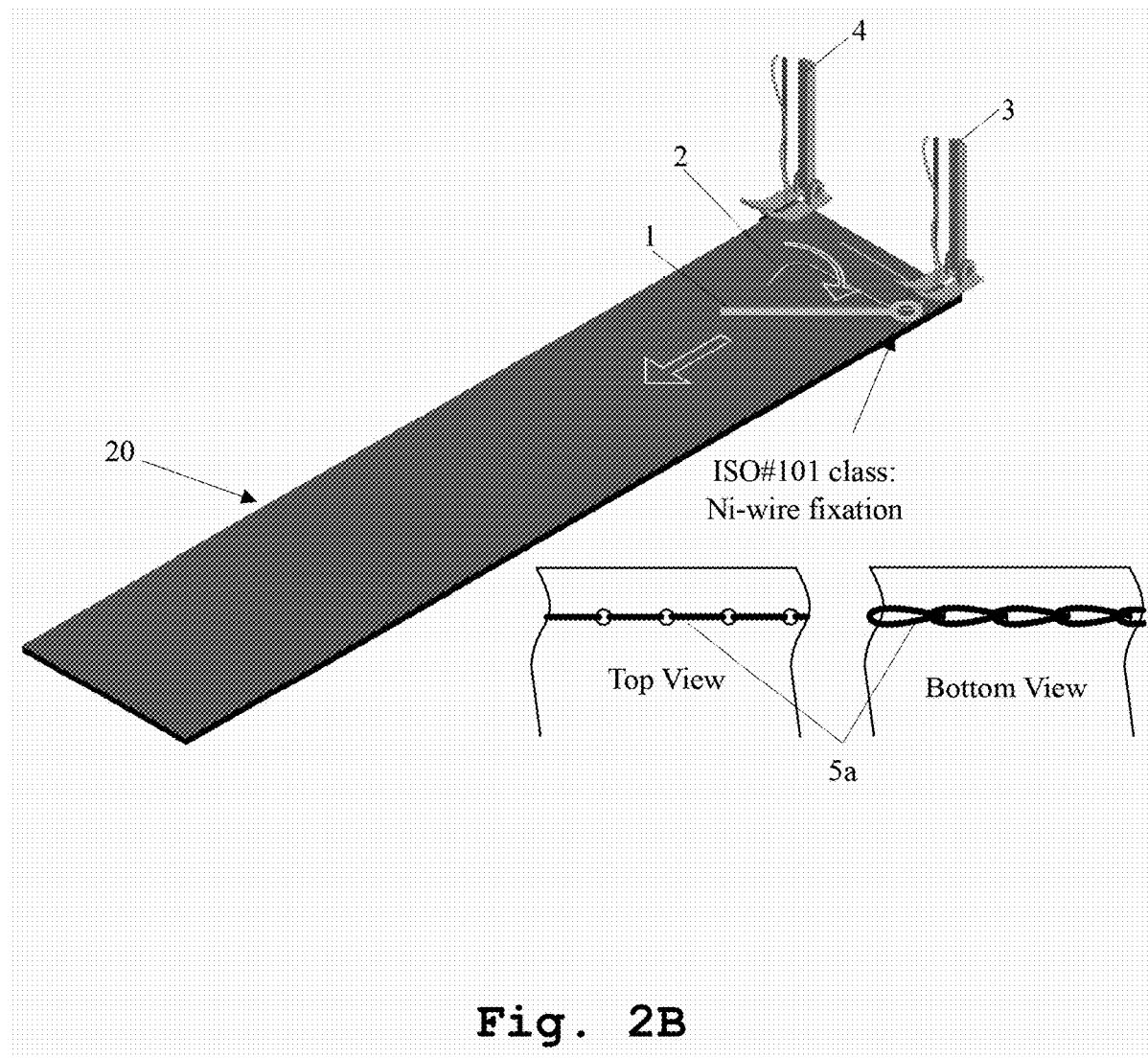
FIG. 2B shows a second snapshot with respect to the formation of the inventive photovoltaic cells assembly.

In accordance with FIG. 2B, a swinging beam 1 (for example working and/or mounted together with two sewing presser feet 3, 4) aligns and guides a conductive Ni-wire 2 with a zigzag pattern on the front surface 22a of the cell 20 or the CIGS cell, respectively. When the beam swings to the bottom edge 21a of the cell 20, the Ni-wire 2 is attached with a polymer yarn 5a (non-conductive, potentially thermoplastic and/or optically transparent and/or with a similar refractive index as module encapsulant material used for the respective embedding process and/or with a similar or higher melting point temperature) to the CIGS cell surface using a stitch ISO #101 class ("chainstitch").

The stitch is applied using the machine stitching presser foot 3 and a corresponding needle. The needle pierces a hole through the CIGS cell 20 and simultaneously feeds the non-conductive yarn 5a through the hole. When the needle retracts, a yarn loop is left behind, which is pulled along the backside surface 22b of the CIGS cell 20 to the area where the needle will feed through a subsequent loop through the CIGS cell 20 (and yarn loop).

Alternatively, making holes through the cells (such as at the first edge and at the second edge) before stitching may be advantageous. Such holes can be made simultaneously with the stitching, for example, by using 2 needles: a first needle to punch a hole, immediately followed by a second needle to do the stitching as already mentioned above. As an alternative, the holes can be made beforehand, for example, by punching or by etching.

This stitch may be a stitch ISO #101 class; it is formed by one needle thread (yarn) passing through the CIGS cell 20 and interlooping with itself on the underside of the seam. Meanwhile, the swinging beam 1 progresses along the cell 20 from right (right edge 21c) to left (left edge 21), together with both presser feet 3, 4 and corresponding needles (or alternatively, vice-versa).

Figure 2C:
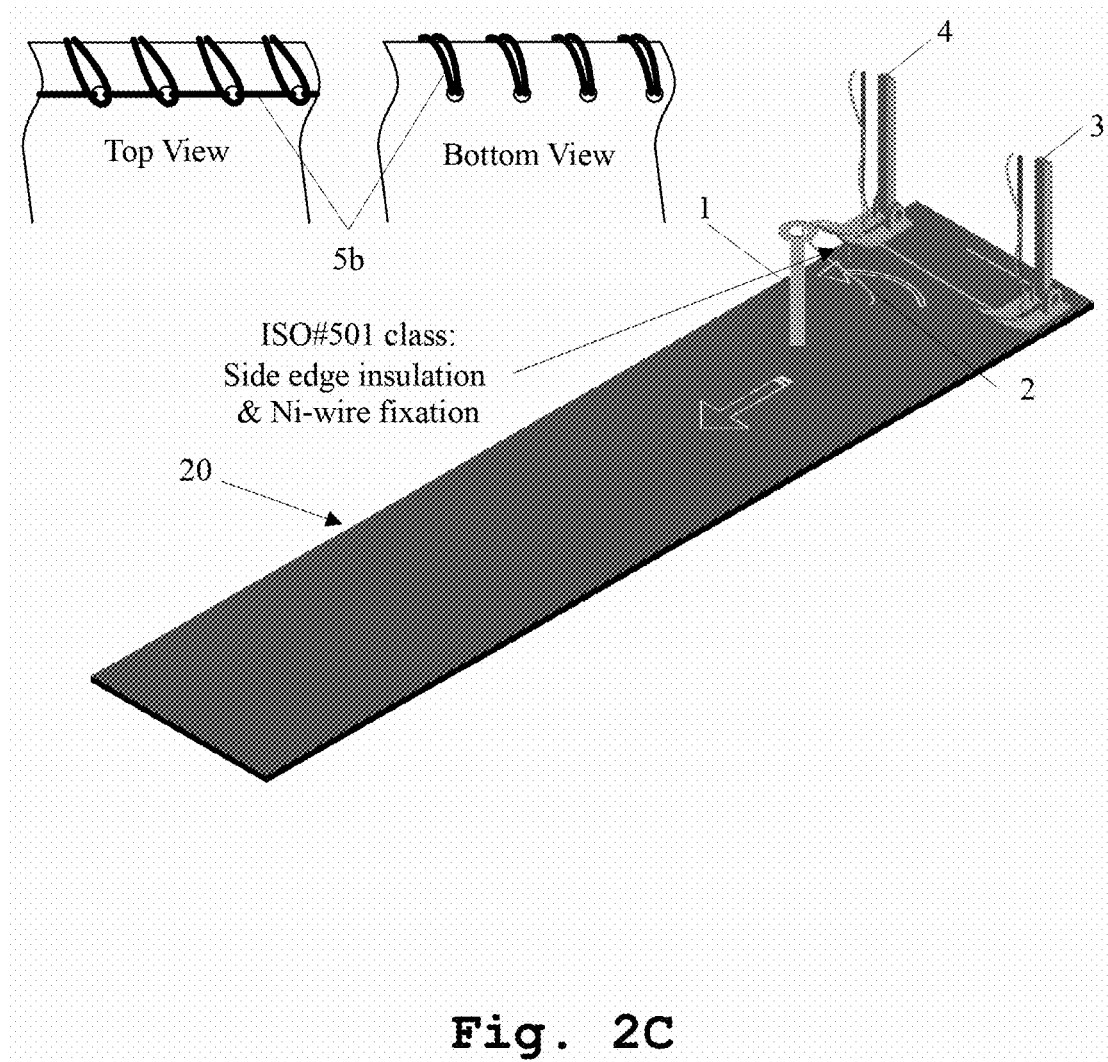
FIG. 2C shows a third snapshot with respect to the formation of the photovoltaic cells assembly.

As the Ni-wire 2 is now fixed (attached) to the front surface 22a of the cell 20, the arm 1 swings to the top edge 21b of the CIGS cell 20. It is attached by a polymer yarn 5b to the CIGS cell 20 using a stitch ISO #501 class ("1-thread Overedge chainstitch") as illustrated by FIG. 2C.

This stitch has the feature to pull the loop that is fed through a hole in the CIGS cell 20, to the side edge (e.g., the second edge 21b) of the cell 20 along the underside surface 22*b* of the cell 20. It is there pulled up along the edge 21*b*. The non-conductive polymer yarn 5*b* is now wrapped around the edge 21*b* of the CIGS cell 20, and simultaneously it is attaching the Ni-wire 2 to the front surface 22*a* of the CIGS cell 20. It is noted that the ISO #501 class "over edge" or "overlock" stitch type is formed with one needle and 1 looper thread with this thread passing round the edge of the CIGS strip being sewn.

The swinging arm or beam 1 extends outside the surface area 22*a* such as beyond the second edge 21*b* of the CIGS cell 20, before returning to the top side of the cell. This results in a Ni-wire loop that is extending beyond the second edge 21*b* of the CIGS cell 20. As the wire 2 crosses the path of the top ISO #501 class stitch again, the wire is attached again to the CIGS cell surface.

Figure 2D:
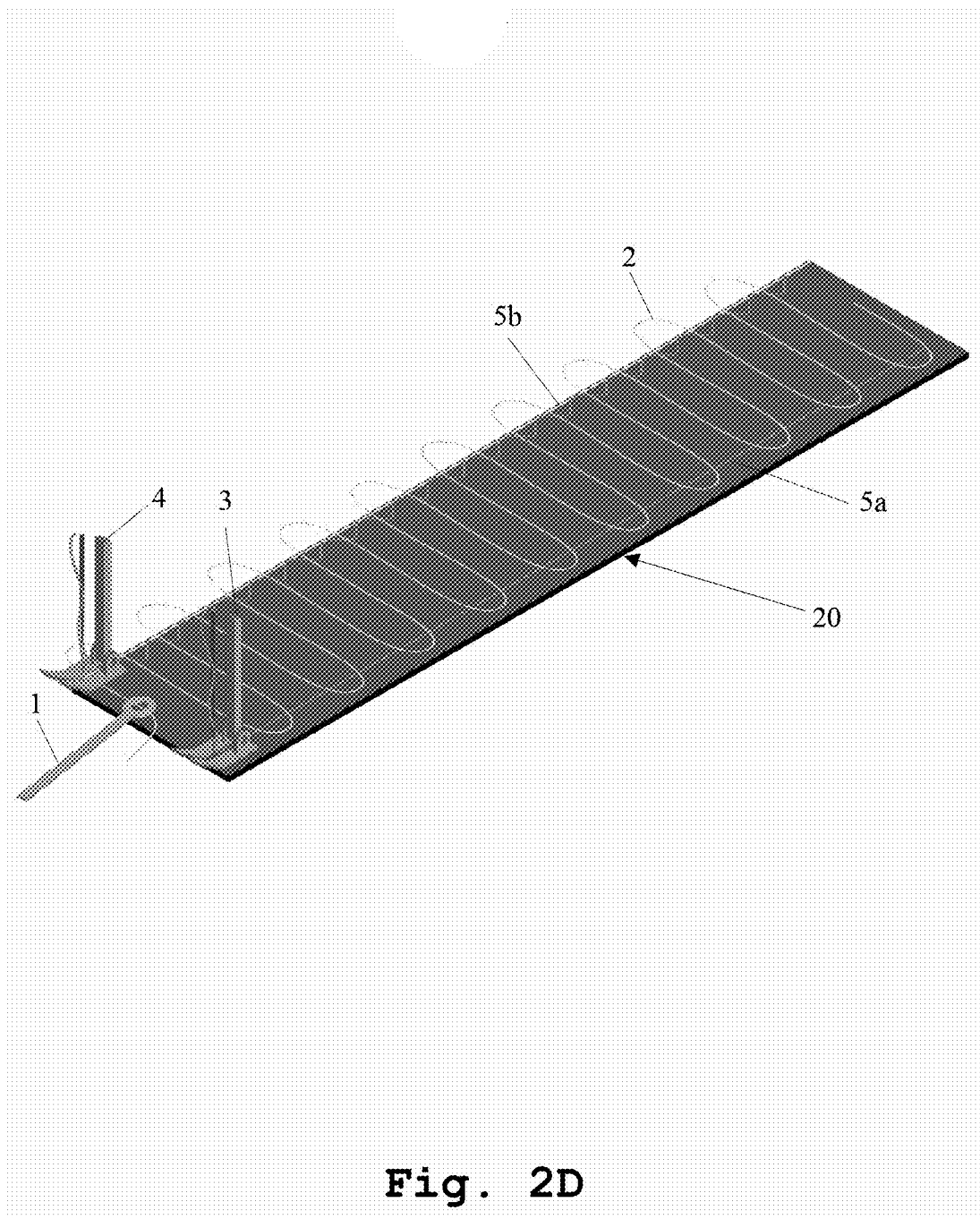
FIG. 2D shows a fourth snapshot with respect to the formation of the photovoltaic cells assembly.

Continuing its trajectory to the bottom edge 21*a* of the CIGS cell 20, the Ni-wire 2 crosses the bottom edge ISO #101 class stitch again and is attached to the CIGS cell surface 22*a*. As such, the zigzag trajectory of the Ni wire 2 is secured on four places on the CIGS cell 20 (two at the top edge 21*b*, two at the bottom edge 21*a*) surface per single zigzag cycle of the swinging beam/arm 1. This sequence of sewing and zigzag arm swinging is repeated along the full length of the first CIGS cell 20, from the third edge 21*c* to the fourth edge 21*d*, as shown in FIG. 2D. Once reaching the respective end, the wire 2 or the yarns 5*a*, 5*b*, respectively, are cut.

Figure 2E:
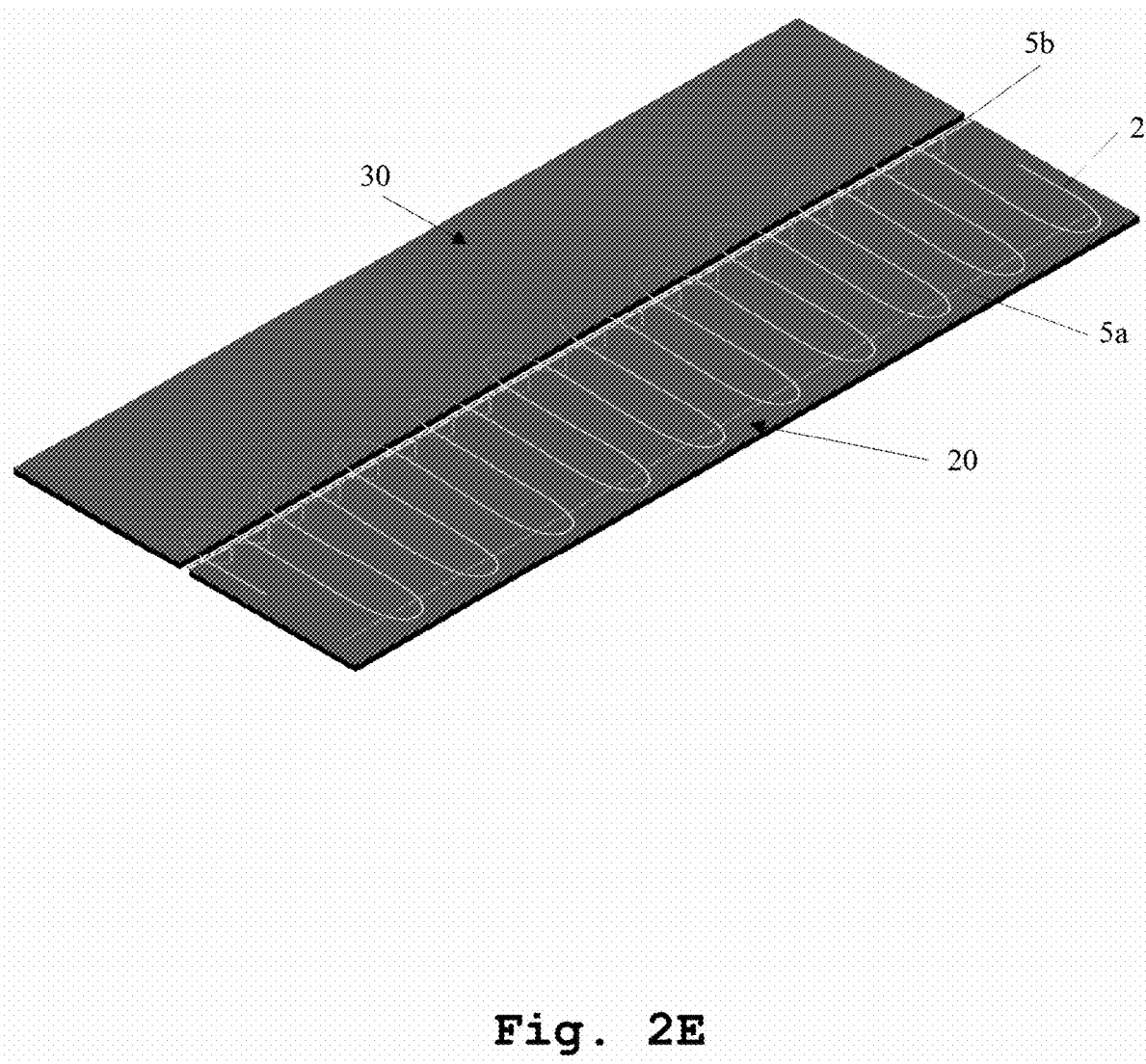
FIG. 2E shows a fifth snapshot with respect to the formation of the photovoltaic cells assembly.

Now, with respect to FIG. 2E, a new CIGS cell strip 30 or a second cell, respectively, is aligned and placed on the Ni-wire part 2 that is extending beyond the top edge 21*b* of the first CIGS cell 20.

It is noted that the second cell 30 comprises edges and surfaces being analogously denoted with reference signs 31*a*-31*d*, 32*a*, and 32*b* with respect to the first cell 20. The top edge 21*b* of the first cell 20 that is wrapped with the polymer thread/yarn 5*b* is separated from the second cell bottom edge 31*a* (yarn 5*b* may act as a spacer, stitch ISO #501 class); in some examples, this may avoid side contacts causing shunts and/or unwanted electrical contacts between both cell strips 20 and 30.

Figure 2F:
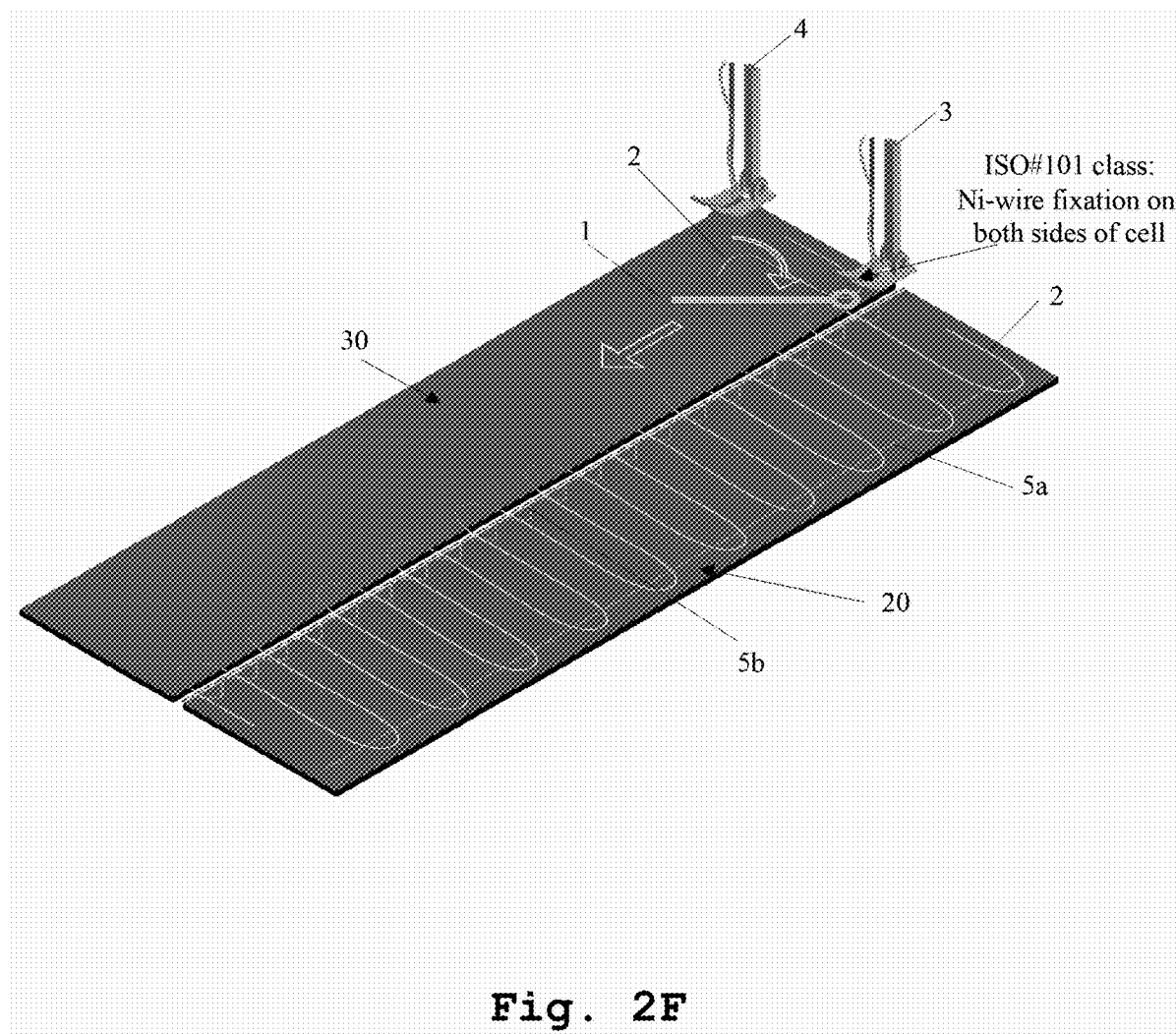
FIG. 2F shows a sixth snapshot with respect to the formation of the photovoltaic cells assembly.

The stitching sequence of the first step is repeated on the second cell 30 according to FIG. 2F. As the path of the stitch ISO #101 class at the bottom edge 31*a* of the second cell strip 30 is also crossing the Ni wire 2 extending/protruding from the first cell 20 underneath the second cell 30, this Ni-wire 2 is, simultaneously with the fixing of the second Ni-wire 2' on the front surface 32*a* of the second CIGS cell strip 30, also attached to the backside surface "32*b*" of the second CIGS cell strip 30.

As such, an electrical interconnection may be created between the top transparent layer on the surface of the first CIGS cell strip 20 and the underside metal surface of the second CIGS cell strip 30. Simultaneously, both cell strips 20, 30 are physically attached to each other to create a cell string.

Figure 2G:
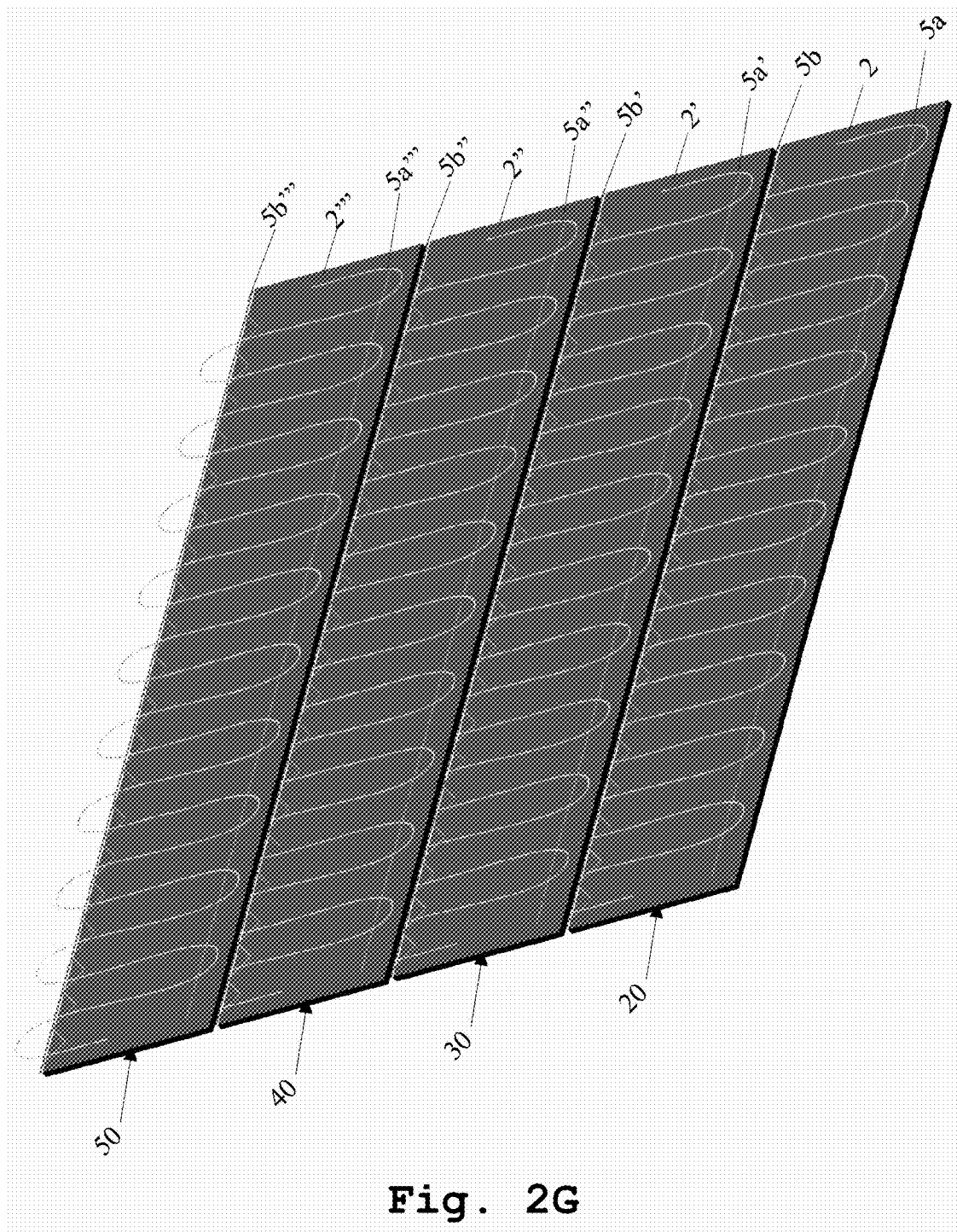
FIG. 2G shows a seventh snapshot with respect to the formation of the photovoltaic cells assembly.

Furthermore, the respective ones of the above-mentioned steps are analogously repeated to create a new roll with exemplarily 60 CIGS strips connected in series. For instance. FIG. 2G shows four CIGS strips 20, 30, 40, 50 being connected. In this context, it is noted that four pieces of wire 2, 2', 2", 2'" have been used. This analogously applies with respect to the yarn (5*a*, 5*a*', 5*a*", 5*a*'") for the corresponding bottom edge and the yarn (5*b*, 5*b*', 5*b*", 5*b*'") for the corresponding top edge.

Figure 2H:
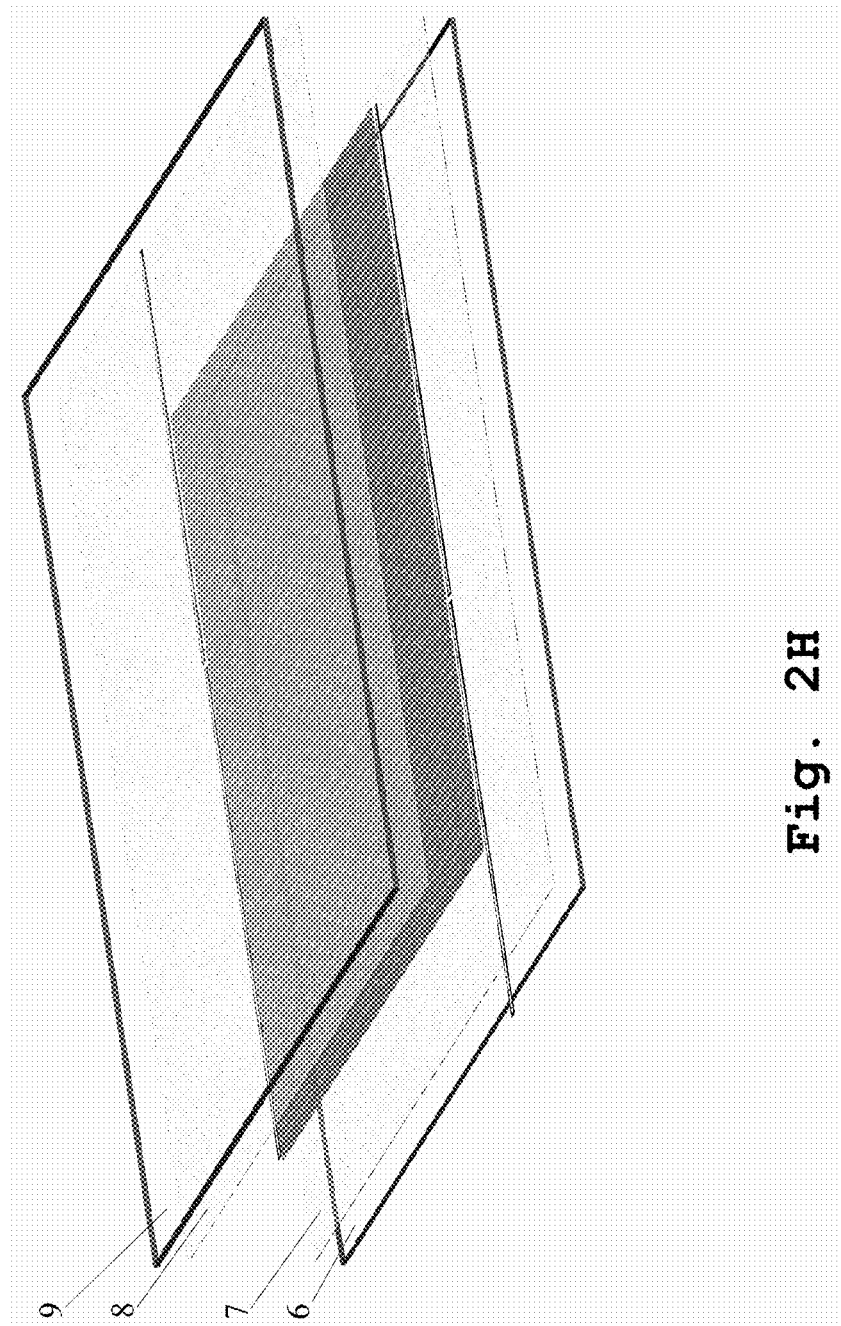
FIG. 2H shows an eighth snapshot with respect to the formation of the photovoltaic cells assembly.

It is further noted, that integration of the CIGS cell strings in a photovoltaic module vary based on the final application. In what follows, a possible example of a short process is described to create a module consisting of a transparent front sheet and a back sheet as illustrated by FIG. 2H. However, other module configurations of integration of CIGS cell strings are possible.

In accordance with FIG. 2H, during lay-up, a glass- or alternative transparent substrate carrier 9 (rigid or flexible) is used to align an encapsulant sheet 8 on. The encapsulant sheet may comprise or consist of a non-reactive, potentially thermoplastic, encapsulant material. The encapsulant sheet may comprise a single layer or it may be a multi-layer sheet. The encapsulant sheet may be a non-reinforced encapsulant sheet or it may be a reinforced encapsulant sheet comprising a glass fibre filling.

An encapsulant sheet with glass fibre filling may provide a limited coefficent of thermal expansion (CTE) compared to a non-reinforced encapsulant sheet.

Furthermore, it offers the ability to better secure the Ni-wires on the CIGS cell surfaces and avoids Ni-wire shifting/rolling during lamination (which would compromise electrical contact quality between the transparent conductive layer of the CIGS cell and the Ni-wire). The encapsulant may be consisting of thermoplastic non-reactive polyolefin material compatible with CIGS cell technology, or alternatively an encapsulant should be used that is compatible with CIGS cell technology.

Strings of interconnected CIGS cells are aligned along one another on the encapsulant sheet 8, and interconnected (via e.g. welding, soldering, conductive adhesives etc.) with bussing ribbons. Suitable terminal ribbons are foreseen at the beginning and end of the CIGS series interconnected cells/strings. Furthermore, a second (glass-fibre reinforced) encapsulant sheet 7 may be applied on the CIGS cell string area, and the stack may be covered with a back substrate 6 (for instance, back sheet, glass or the like).

Moreover, during a vacuum lamination step, the module layer stack may be heated to a temperature (for instance, 155-165 degrees Celsius) that is above the melting temperature of the encapsulant material (melting point of 130-150 degrees Celsius) to allow full embedding of the CIGS strings, and to avoid any cavities (but below 180° C. to avoid deterioration of the CIGS layers).

Figure 2I:
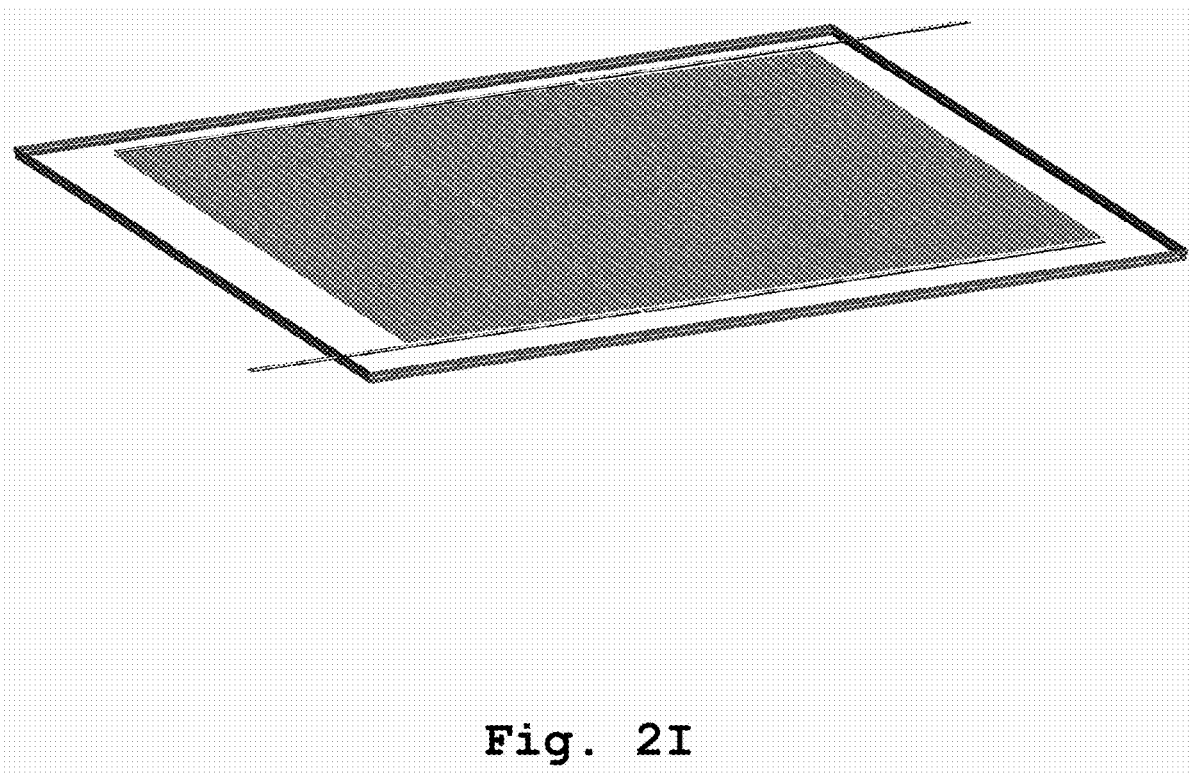
FIG. 2I shows a ninth snapshot with respect to the formation of the photovoltaic cells assembly or an embodiment of the photovoltaic cells assembly, respectively.

The thermoplastic yarn material will melt as melting temperature is in the same range as the melting temperature of the encapsulant. The corresponding refractive index may be similar to the encapsulant material, improving aesthetical appearance (no yarns visible after lamination). Furthermore, this may result in an example embodiment as illustrated by FIG. 2I.

Figure 3A:
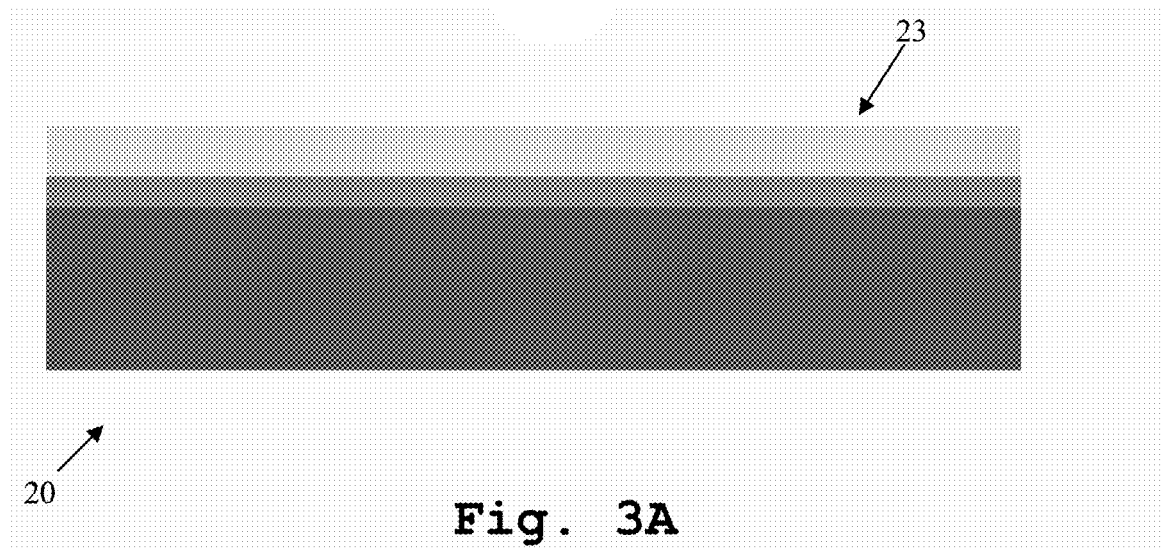
FIG. 3A shows a first snapshot with respect to the formation of a photovoltaic cells assembly according to another embodiment.

Now, with respect to FIG. 3A, a first snapshot with respect to the formation of a photovoltaic cells assembly according to another embodiment is shown.

In comparison with the example embodiment illustrated by the snapshots according to FIG. 2A to 2I, in accordance with FIG. 3A, this embodiment further comprises a placement of a non-conductive optically transparent foil 23 with one to a few millimeters, for example 3 millimeters, overlap over the second edge, such as the top, of the cell 20 in an example CIGS strip.

For example, this configuration will isolate in a later stage the conductive wire from the side wall at the second edge of the CIGS strip. This will thereby also separate and isolate in a later stage the second edge of the CIGS strip from a first edge of a further CIGS strip to be provided next to it. The transparent foil may be made from or comprises a thermoplastic material such as a polyolefin material or a thermoset material. The transparent foil may be a multilayer foil, such as for example a foil comprising an optically transparent polyurethane layer and a thermoset layer or a thermoplastic layer such as a polyolefin layer or an acrylic layer. By slightly heating this material (for instance, 60 to 120 degrees Celsius, for example 70 to 110 degrees Celsius) it will become sticky and stay fixed onto the CIGS strip.

It is noted that the following steps are explained by analogy with the exemplary embodiment illustrated by the snapshots of FIG. 2A to FIG. 2I with additions, omissions, or alternatives, respectively. It is further noted that all or at least a part of the exemplary embodiments can also be combined in order to form further exemplary embodiments.

In this context, it is noted that the pieces or cell strips, respectively, can also be up to 4-5 cm×50 cm (or other width, for instance, 30 cm). Advantageously, a piece of 4-5×30 cm would match with the current of a half silicon cell (i.e., 5A). This would allow to use conventional half-cell silicon invertors for modules made out of these CIGS cells.

Figure 3B:
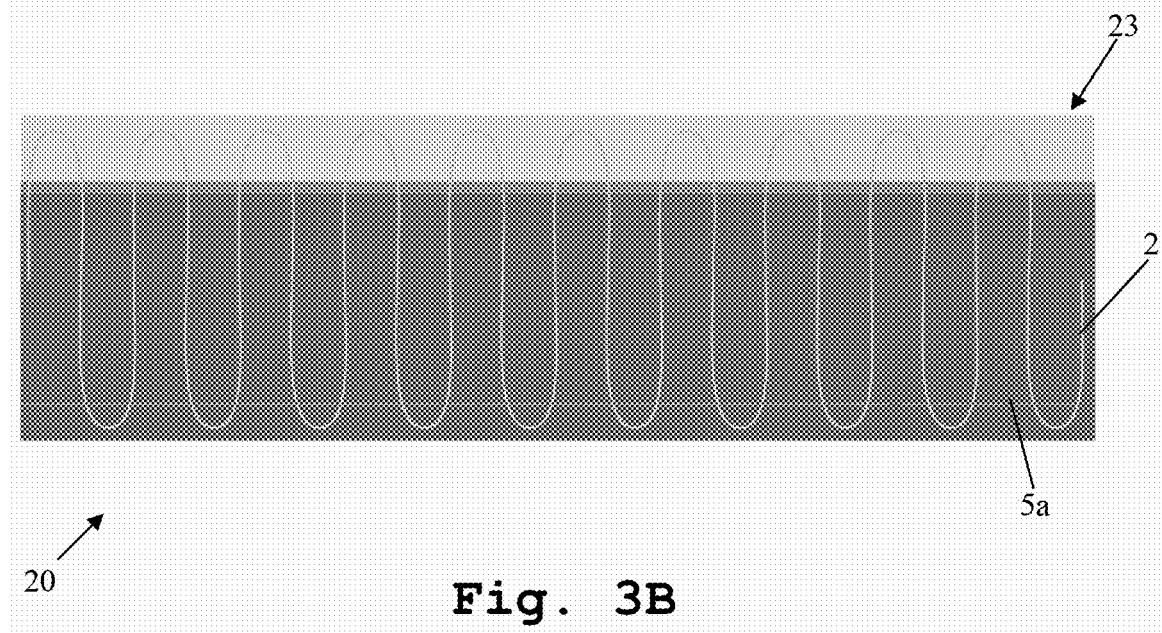
FIG. 3B shows a second snapshot according to the another embodiment shown in FIG. 3A.

Furthermore, for instance, the following steps may result in FIG. 3B. A swinging beam such as the above-mentioned may align and guide a conductive Ni-wire such as wire 2 with a zigzag pattern on the surface of the CIGS cell such as the surface 22a.

When the beam swings to the bottom side of the cell, the Ni-wire 2 is attached with a polymer yarn 5a (non-conductive, potentially thermoplastic, optically transparent, similar refractive index as module encapsulant material used for embedding process, and with a similar or higher melting point temperature) to the CIGS cell surface such as using a stitch ISO #101 class ("chainstitch").

The stitch is applied using a machine stitching presser foot and a corresponding needle. The needle pierces a hole through the CIGS cell 20 and simultaneously feeds the non-conductive yarn 5a through the hole. When the needle retracts, a yarn loop is left behind, which is pulled along the backside surface of the CIGS cell 20 to the area where the needle will feed through a subsequent loop through the CIGS cell 20 (and yarn loop).

This stitch may be a stitch ISO #101 class; it is formed by one needle thread (yarn) 5a passing through the CIGS cell 20 and interlooping with itself on the underside of the seam. Meanwhile, the swinging beam progresses along the cell 20 from right to left (on the drawing). As the Ni-wire 2 is now fixed (attached) to the front side of the cell 20, the arm swings to the top side of the CIGS cell 20 over the non-conductive transparent foil 23. Because this foil is sticky, the Ni-wire 2 will stick where it is placed onto the non-conductive transparent foil 23. Eventually a slightly pressing roller or bar could fix the Ni-wire 2 tighter onto the non-conductive transparent sheet 23.

The swinging arm or beam extends outside the surface area of the CIGS cell 20, before returning to the top side of the cell 20. This results in a Ni-wire loop that is extending out of the CIGS cell 20. Continuing its trajectory to the bottom side of the CIGS cell 20, the Ni-wire 2 crosses the bottom side ISO #101 class stitch again and is attached to the CIGS cell surface.

As such, the zigzag trajectory of the Ni-wire 2 may be secured on the sticky part of the transparent foil 23 (at the top side of the CIGS cell 20) and at two places at the bottom side by the stitch per single zigzag cycle of the swinging beam/arm. This sequence of sewing and zigzag arm swinging is repeated along the full length of the first CIGS cell 20. Once reaching the end, the wires 2 (and yarns 5a) are cut.

Furthermore, and not explicitly illustrated by further snapshots in the context of the example embodiment discussed in connection with the snapshots of FIG. 3A and FIG. 3B, a new CIGS cell strip such as the above-mentioned cells 30, 40, 50 may be aligned and placed on the Ni-wire part that is extending beyond the top side of the first CIGS cell 20. Moreover, the top side border of the first cell 20 is isolated from the second cell bottom side border by the non-conductive transparent foil 23. This avoids side contacts causing shunts or unwanted electrical contacts between both cell strips.

It is further noted that the above-mentioned stitching sequence may be repeated on the second cell. As the path of the stitch ISO #101 class at the bottom side of the second cell strip is also crossing the Ni-wire extending/protruding from the first cell 20 underneath the second cell, this Ni-wire is, simultaneously with the fixing of the second Ni-wire on the top surface of the second CIGS cell strip, attached to the backside surface of the second CIGS cell strip. As such, an electrical interconnection is created between the top transparent layer on the surface of the first CIGS cell strip 20 and the underside metal surface of the second CIGS cell strip. Simultaneously, both cell strips are physically attached to each other to create a cell string. It also simultaneously will fix the non-conductive foil 23 to the backside of the CIGS cell.

Figure 4:
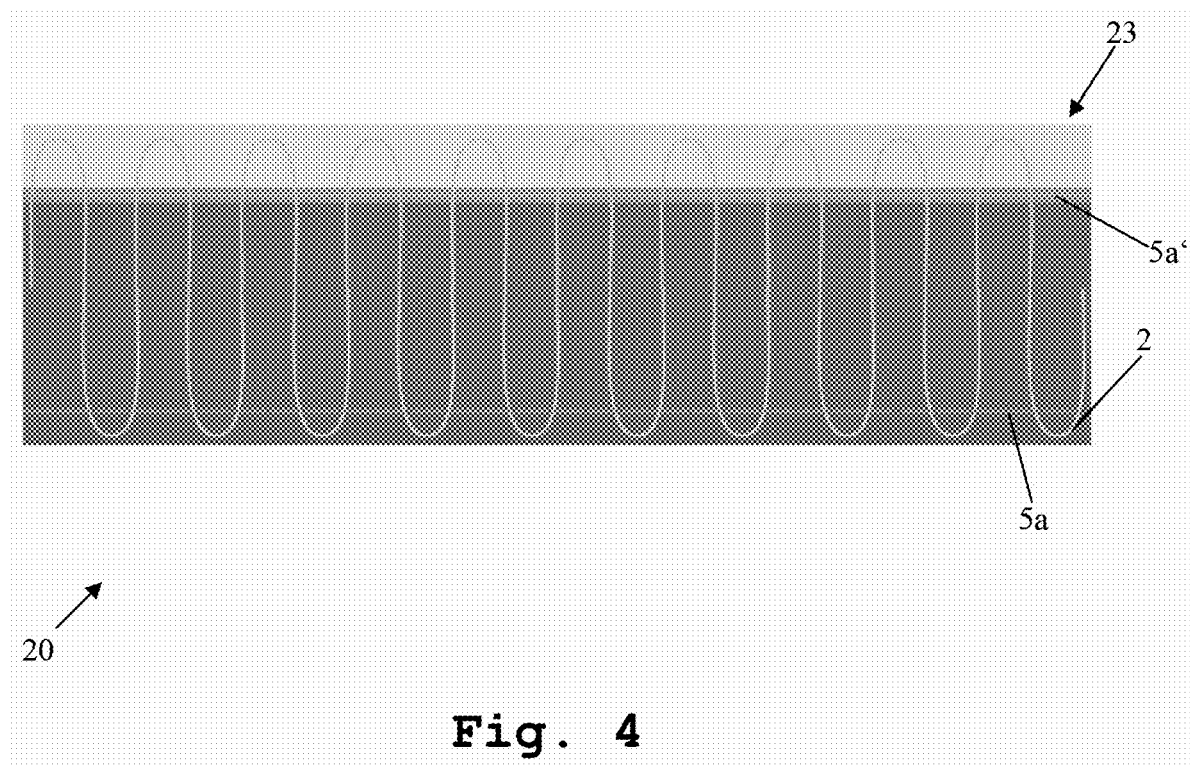
FIG. 4 shows a snapshot with respect to the formation of a photovoltaic cells assembly according to one embodiment.

Finally, with respect to FIG. 4, an example snapshot with respect to the formation of a photovoltaic cells assembly in the context of another embodiment is shown.

In comparison with the example embodiment illustrated by the snapshots according to FIG. 2A to 2I, in accordance with FIG. 4, this embodiment further comprises a placement of a non-conductive optically transparent foil 23 with one to a few millimeters, such as three millimeters, overlap over the top of the CIGS strip 20. This will isolate in a later stage the conductive wire 2 from the side wall of the CIGS strip 20. The transparent foil 23 may comprise a thermoplastic material and could be a polyolefin material. By slightly heating this material (for instance, 60 to 120 degrees Celsius and/or 70 to 110 degrees Celsius) it will become sticky and stay fixed onto the CIGS strip 20.

It is noted that the following steps are explained by analogy with the example embodiment illustrated by the snapshots of FIG. 2A to FIG. 2I and the example embodiment explained by the snapshots according to FIG. 3A and FIG. 3B with additions, omissions, or alternatives, respectively. It is further noted that all or at least a part of the embodiments can also be combined in order to form further example embodiments.

Furthermore, for instance, the following steps may result in FIG. 4: A swinging beam such as the above-mentioned one 1 (e.g., working and/or mounted together with two sewing presser feet such as the above-mentioned ones 3 and 4) aligns and guides a conductive Ni-wire 2 with a zigzag pattern on the surface of the CIGS cell.

When the beam swings to the bottom side of the cell 20 the Ni-wire 2 is attached with a polymer yarn 5a, 5a' (non-conductive, potentially thermoplastic, optically transparent, similar refractive index as module encapsulant material used for embedding process, and with a similar or higher melting point temperature) to the CIGS cell surface using a stitch ISO #101 class ("chainstitch").

As it can further be seen from FIG. 4, in contrast to FIG. 3B, the wire 2 is not only attached to the first edge or the bottom edge, respectively, of the cell 20 with the aid of the yarn 5a, but also to the second edge or the top edge, respectively, of the cell 20 with the aid of the yarn 5a' such as by using the same stitch type.

The stitch is applied using the respective machine stitching presser foot and a corresponding needle. The needle pierces a hole through the CIGS cell 20 and simultaneously feeds the non-conductive yarn 5a, 5a' through the hole. When the needle retracts, a yarn loop is left behind, which is pulled along the backside surface of the CIGS cell 20 to the area where the needle will feed through a subsequent loop through the CIGS cell 20 (and yarn loop).

This stitch may be a stitch ISO #101 class; it is formed by one needle thread (yarn 5a or 5a', respectively) passing through the CIGS cell 20 and interlooping with itself on the underside of the seam. Meanwhile, the swinging beam progresses along the cell 20 from right to left (on the drawing), together with both presser feet and corresponding needles (or alternatively, vice-versa).

As the Ni-wire 2 is now fixed to the front side of the cell 20, the arm swings to the top side of the CIGS cell 20. As already mentioned above, it is attached by the polymer yarn 5a' using a stitch ISO #101 class ("chainstitch"). This will stitch the non-conductive transparent foil 23 and the Ni-wire 2 at the same time together. The Ni-wire 2 will be on top of this non-conductive transparent foil 23.

The swinging arm or beam extends outside the surface area of the CIGS cell 20, before returning to the top side of the cell 20. This results in a Ni-wire loop that is beyond the second edge of the CIGS cell 20 and will lay up onto the non-conductive transparent foil 23. As the wire 2 crosses the path of the top ISO #101 class stitch again, the wire 2 is attached again to the transparent foil 23.

Continuing its trajectory to the bottom side of the CIGS cell 20, the Ni-wire 2 crosses the bottom side ISO #101 class stitch again and is attached to the CIGS cell surface.

As such, the zigzag trajectory of the Ni-wire 2 may be secured on four places on the CIGS cell 20 (two at the top side, two at the bottom side) surface per single zigzag cycle of the swinging beam/arm. At the top side, the non-conductive transparent foil 23 may be stitched between the Ni-wire 2 and the CIGS cell 20. This sequence of sewing and zigzag arm swinging is repeated along the full length of the first CIGS cell 20. Once reaching the end, the wires 2 and/or yarns 5a, 5a' are cut.

Furthermore, and not explicitly shown in the context of this embodiment, a new CIGS cell strip may be aligned and placed on the Ni-wire part that is extending beyond the top side of the first CIGS cell 20. The top side border of the first cell 20 is isolated from the second cell bottom side border by the non-conductive transparent foil 23; this avoids side contacts causing shunts or unwanted electrical contacts between both cell strips.

The stitching sequence of the above-mentioned step may be repeated on the second cell. As the path of the stitch ISO #101 class at the bottom side of the second cell strip is also crossing the Ni-wire extending/protruding from the first cell 20 underneath the second cell, this Ni-wire is, simultaneously with the fixing of the second Ni-wire on the top surface of the second CIGS cell strip, attached to the backside surface of the second CIGS cell strip. As such, an electrical interconnection is created between the top transparent layer on the surface of the first CIGS cell strip 20 and the underside metal surface of the second CIGS cell strip. Simultaneously, both cell strips are physically attached to each other to create a cell string.

It is noted that the pattern of the conductive wire can be different for different connected cells. In other words, a different conductive wire pattern may be used for different cell strips within a string. For instance, this may be done for creating a visual effect and/or for aesthetic reasons.

While various embodiments of the present invention have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the included drawings. In addition, while a particular feature may have been disclosed with respect to only one of several implementations, such feature may be combined with one or more other features of the other implementations as may be desired and advantageous for any given or particular application.

What is claimed is:

1. A method for interconnecting photovoltaic cells in order to form a photovoltaic cells assembly, the method comprising the steps of:
    providing a first photovoltaic cell comprising a first surface, a second surface, a first edge, and a second edge,
    arranging a conductive wire on the first surface of the first photovoltaic cell according to a certain pattern, and
    attaching the conductive wire to the first surface of the first photovoltaic cell with the aid of a first non-conductive yarn by stitching in an area of the first edge of the first photovoltaic cell according to a first stitch type.

2. The method according to claim 1, wherein the method comprises the step of additionally attaching the conductive wire to the first surface of the first photovoltaic cell with the aid of a second non-conductive yarn by stitching in an area of the second edge of the first photovoltaic cell according to a second stitch type.

3. The method according to claim 2, wherein the first photovoltaic cell comprises or is a thin-film cell selected from the group consisting of: a copper indium gallium selenide cell or a copper indium selenide cell or a cadmium telluride cell or a perovskite cell or an amorphous silicon cell, and/or
    wherein the first edge and the second edge are parallel or approximately parallel with respect to each other, and/or
    wherein the conductive wire comprises at least one of copper, nickel, steel, stainless steel, aluminium, carbon fiber, or any combination thereof, and/or
    wherein the certain pattern comprises at least one of a zig-zag pattern, a sine-shaped pattern, a pattern being similar to a sine shape, or any combination thereof, and/or
    wherein the first non-conductive yarn comprises at least one of polyolefin, nylon, or the combination thereof, and/or
    wherein the second non-conductive yarn comprises at least one of polyolefin, nylon, or the combination thereof.

4. The method of claim 2, wherein for arranging the conductive wire, a swinging arm or beam is used, and/or
    wherein for stitching, a respective machine stitching presser foot and a corresponding needle are used.

5. The method of claim 2, wherein stitching according to the second stitch type is configured to pull a loop being fed through a hole in the first photovoltaic cell with the aid of the second non-conductive yarn over an edge of the first photovoltaic cell along the second surface of the first photovoltaic cell, and/or wherein the second stitch type comprises or is an ISO #501 stitch or an over-edge stitch or an overlock stitch or an over-edge chainstitch.

6. The method of claim 5, wherein the over-edge chainstitch is a one-thread over-edge chainstitch.

7. The method of claim 5, wherein for arranging the conductive wire, a swinging arm or beam is used, and/or
wherein for stitching, a respective machine stitching presser foot and a corresponding needle are used.

8. The method of claim 7, wherein the first photovoltaic cell comprises or is a thin-film cell and/or
wherein the first edge and the second edge are parallel or approximately parallel with respect to each other, and/or
wherein the conductive wire comprises at least one of copper, nickel, stainless steel, aluminum, carbon fiber, or any combination thereof, and/or
wherein the certain pattern comprises at least one of a zig-zag pattern, a sine-shaped pattern, a pattern being similar to a sine shape, or any combination thereof, and/or
wherein the first non-conductive yarn comprises at least one of polyolefin, nylon, or the combination thereof, and/or
wherein, the second non-conductive yarn comprises at least one of polyolefin, nylon, or the combination thereof.

9. The method of claim 8, wherein the thin-film cell is selected from the group consisting of a copper indium gallium selenide cell; a copper indium selenide cell; a cadmium telluride cell; a perovskite cell; or an amorphous silicon cell.

10. The method of claim 8, wherein for arranging the conductive wire, a swinging arm or beam is used, and/or
wherein for stitching, a respective machine stitching presser foot and a corresponding needle are used.

11. The method of claim 1, wherein for arranging the conductive wire, a swinging arm or beam is used, and/or
wherein for stitching, a respective machine stitching presser foot and a corresponding needle are used.

12. The method of claim 1, wherein the conductive wire is arranged in such a manner that at least a part of the conductive wire extends over the first surface of the first photovoltaic cell in the area of the second edge of the first photovoltaic cell.

13. The method of claim 12, wherein the at least a part of the conductive wire is arranged in a wire loop or a wire loop pattern.

14. The method of claim 1, wherein stitching according to the first stitch type is configured in a manner that the first non-conductive yarn passes through the first photovoltaic cell and/or interloops with itself on the second surface of the first photovoltaic cell, and/or
wherein the first stitch type comprises or is an ISO #101 stitch or a chainstitch.

15. The method of claim 14, wherein the method comprises the step of cutting the conductive wire if the certain pattern covers the first surface of the first photovoltaic cell according to a predefined manner, and/or
wherein the method comprises the step of cutting the first non-conductive yarn if the certain pattern covers the first surface of the first photovoltaic cell according to a predefined manner, and/or
wherein, the method comprises the step of cutting the second non-conductive yarn if the certain pattern covers the first surface of the first photovoltaic cell according to a predefined manner.

16. The method of claim 1, wherein the method comprises the steps of:
providing a second photovoltaic cell comprising a first surface, a second surface, a first edge, and a second edge, and
aligning the second photovoltaic cell and the first photovoltaic cell on the basis of the second edge of the first photovoltaic cell and the first edge of the second photovoltaic cell,
wherein, the second photovoltaic cell is aligned in such a manner that a surface of the second photovoltaic cell covers the part of the conductive wire extending over the first surface of the first photovoltaic cell.

17. The of claim 1, wherein the method comprises the step of repeating at least a part of the method steps according to claim 1 with respect to at least one further photovoltaic cell.

18. The method of claim 17, wherein a wire loop or a wire loop pattern of the conductive wire extending over the first surface of the first photovoltaic cell is simultaneously attached to a second surface of a second photovoltaic cell through attaching a conductive wire to a first surface of the second photovoltaic cell with the aid of the first non-conductive yarn by stitching in the area of the first edge of the second photovoltaic cell according to the first stitch type.

19. The method of claim 18, wherein the method comprises the step of encapsulating the photovoltaic cells assembly with the aid of an encapsulating material such as a thermoplastic non-reactive polyolefin material.

20. The method according to claim 19, wherein the melting point of the encapsulating material is below 180 degrees Celsius.

21. The method of claim 20, wherein the melting point of the encapsulating material is between 140 and 145 degrees Celsius.

22. The method of claim 19, wherein the melting point of the first non-conductive yarn is in the same range as or equal to the melting point of the encapsulating material, and/or wherein the melting point of the second non-conductive yarn is in the same range as or equal to the melting point of the encapsulating material.

* * * * *